US008880372B2

(12) United States Patent
Rovinsky et al.

(10) Patent No.: US 8,880,372 B2
(45) Date of Patent: Nov. 4, 2014

(54) RELATIVE TIME MEASUREMENT SYSTEM WITH NANOSECOND LEVEL ACCURACY

(75) Inventors: Jacob Rovinsky, Modiin (IL); Ernest Solomon, Rehovot (IL); Maxim Hankin, Kiryat Ono (IL); Israel Kashani, Kiryat Ono (IL)

(73) Assignee: Israel Aerospace Industries Ltd., Lod (IL)

( * ) Notice: Subject to any disclaimer, the term of this patent is extended or adjusted under 35 U.S.C. 154(b) by 440 days.

(21) Appl. No.: 13/318,267

(22) PCT Filed: Apr. 29, 2010

(86) PCT No.: PCT/IL2010/000346
§ 371 (c)(1),
(2), (4) Date: Oct. 31, 2011

(87) PCT Pub. No.: WO2010/125569

PCT Pub. Date: Nov. 4, 2010

(65) Prior Publication Data

US 2012/0045029 A1 Feb. 23, 2012

(30) Foreign Application Priority Data

Apr. 30, 2009 (IL) .......................................... 198489

(51) Int. Cl.
*G06F 19/00* (2011.01)
*G01R 35/04* (2006.01)
*G04G 7/00* (2006.01)

(52) U.S. Cl.
CPC ........................................ *G04G 7/00* (2013.01)
USPC ................ 702/89; 342/464; 455/502; 702/75

(58) Field of Classification Search
CPC ..... G01S 19/256; G01S 5/0009; G01S 5/021; G01S 5/14; G01S 19/04; G01S 19/07; G01S 19/41; G04G 7/026; G04G 7/00; G04G 21/04; G04G 3/00; G04G 5/002; G04F 10/00; G04F 10/10; G04F 10/04; G04F 10/06; G04R 20/10; H04W 24/10; H04W 28/04; H04W 36/00; H04W 52/0219; H04W 52/0245; H04W 52/029; H04W 56/0045; H04W 84/18
USPC ............. 702/70, 71, 74, 75, 79, 89, 125, 176, 702/177, 178, 187, 191, 193; 324/76.39; 342/357.31, 463, 464, 465; 368/156; 455/502; 701/471
See application file for complete search history.

(56) References Cited

U.S. PATENT DOCUMENTS

| | | |
|---|---|---|
| 5,274,545 A | 12/1993 | Allan et al. |
| 5,477,458 A | 12/1995 | Loomis |

(Continued)

FOREIGN PATENT DOCUMENTS

| | | |
|---|---|---|
| WO | WO 01/61426 A2 | 8/2001 |

OTHER PUBLICATIONS

Goad, "Surveying with the Global Positioning System," *Global Positioning System: Theory and Applications*, 1997, pp. 501-517, vol. II, Chapter 18.

(Continued)

*Primary Examiner* — John H Le
(74) *Attorney, Agent, or Firm* — Oliff PLC

(57) ABSTRACT

A system for instantaneous and continuous nanosecond-level accuracy determination of a relative time offset between at least two non-collocated timing units, the system including at least two non-collocated timing units located at known positions, each timing unit comprising a frequency source and a collocated receiver, each frequency source being disciplined at a frequency domain using a time source to generate corrections of the relative frequency drift between the frequency source and the time source.

23 Claims, 4 Drawing Sheets

(56) References Cited

U.S. PATENT DOCUMENTS

| | | | | |
|---|---|---|---|---|
| 6,308,076 | B1 * | 10/2001 | Hoirup et al. | 455/502 |
| 7,142,154 | B2 | 11/2006 | Quilter et al. | |
| 7,492,316 | B1 | 2/2009 | Ameti et al. | |
| 8,253,628 | B2 * | 8/2012 | Duffett-Smith et al. | 342/464 |

OTHER PUBLICATIONS

Parkinson, "GPS Error Analysis," *Global Positioning System: Theory and Applications*, 1997, pp. 469-483, vol. II, Chapter 11.

* cited by examiner

RELATIVE TIME MEASUREMENT SYSTEM WITH NANOSECOND LEVEL ACCURACY

REFERENCE TO CO-PENDING APPLICATIONS

Priority is claimed from Israel Application No. 198489, entitled " Relative Time Measurement System with Nanosecond Level Accuracy" filed Apr. 30, 2009.

FIELD OF THE INVENTION

The present invention relates generally to time measurement systems and more particularly to relative time measurement systems.

BACKGROUND OF THE INVENTION

Conventional technology pertaining to certain embodiments of the present invention is described in the following publications inter alia:

U.S. Pat. No. 5,274,545 to Allan describes a device and method for providing accurate time and/or frequency. A unit, such as an oscillator and/or clock provides output indicative of frequency and/or time. The device includes a processing section having a microprocessor that develops a model characterizing the performance of the device, including establishing predicted accuracy variations, and the model is then used to correct the unit output. An external reference is used to provide a reference input for updating the model, including updating of predicted variations of the unit, by comparison of the reference input with the unit output. The ability of the model to accurately predict the performance of the unit improves as additional updates are carried out, and this allows the interval between the updates to be lengthened and/or the overall accuracy of the device to be improved. The accuracy of the output is thus adaptively optimized in the presence of systematic and random variations.

U.S. Pat. No. 7,142,154 to Quilter describes a method and apparatus for providing accurately synchronized timing signals at mutually distant locations, employing a GPS or similar receiver at each location. These receivers are interconnected by a communications network, and exchange data over the network to agree with a common timing reference.

The disclosures of all publications and patent documents mentioned in the specification, and of the publications and patent documents cited therein directly or indirectly, are hereby incorporated by reference.

SUMMARY OF THE INVENTION

The performance of many civilian and military systems depends on time synchronization capability and accuracy. In such systems (e.g., communication, vision and location finding) it is common to use an atomic clock with GNSS aiding. Since an atomic clock is basically a frequency source with a finite accuracy and the GNSS absolute time precision is in the order of tens of nanoseconds, the ultimate time synchronization accuracy may reach about 20 nanoseconds (corresponding to 6-10 m GNSS accuracy). However, sub-meter accuracy for location finding systems requires a time difference measurement with an accuracy level of one nanosecond or below.

Certain embodiments of the present invention seek to provide a system having one nanosecond relative time measurement capability for non-collocated units which is characterized by continuous and instantaneous relative time measurement. Time offset between non-collocated frequency sources at discrete points of time is determined; and frequency drift between the frequency sources is disciplined.

The term "collocated" is used in this context to characterize frequency sources positioned such that the time delay between them is either negligible relative to the accuracy demanded by the application, or can be overcome e.g. by calibration.

There is thus provided, in accordance with at least one embodiment of the present invention, a method for instantaneous and continuous determination of a relative time offset between non-collocated frequency sources having a relative frequency drift therebetween, the determination being carried out at a required nanosecond level accuracy, the method comprising disciplining of frequency drift between the frequency sources at a frequency domain including computing, and applying to the frequency sources, corrections of a relative frequency drift between each frequency source and a single time source, the disciplining being limited by the following condition: the product of a duration of any time period extending between adjacent discrete points of time in a sequence of discrete points of time, multiplied by the sum of all frequency corrections effected during the time period and divided by a frequency value characterizing the frequency sources, is at least one order of magnitude less than the required accuracy; and determining time offset between the non-collocated frequency sources at each discrete point of time in the sequence of discrete points of time.

Also provided, in accordance with at least one embodiment of the present invention, is a system for instantaneous and continuous nanosecond-level accuracy determination of a relative time offset between at least two non-collocated timing units, the system comprising at least two non-collocated timing units located at known positions, each timing unit comprising a frequency source and a collocated receiver, each frequency source being disciplined at a frequency domain using a time source to generate corrections of the relative frequency drift between the frequency source and the time source so as to be limited by the following condition: the product of a duration of any time period extending between adjacent discrete points of time in a sequence of discrete points of time, multiplied by the sum of all frequency corrections effected during the time period and divided by a frequency value characterizing the frequency sources, is at least one order of magnitude less than the required accuracy, each receiver being synchronized by a synchronization signal supplied by the frequency source and being operative to receive an external signal stream defining a time-line and to derive therefrom a stream of pseudo-range sample and integrated Doppler sample pairs, to generate, for each individual pair in at least a subset of the pairs, a periodic pulse synchronized with the frequency source, thereby to define a periodic pulse corresponding to the individual pair and to output each individual pair in the subset, simultaneously with the individual pair's corresponding periodic pulse; and at least one time offset computation unit operative to use the timing units' known positions and at least one sample pair from each of the timing units in order to compute time offset between periodic pulses generated by the two timing units respectively, using a single difference technique.

Further in accordance with at least one embodiment of the present invention, the positions of non-collocated timing units are known at least at decimeter level.

Still further in accordance with at least one embodiment of the present invention, the computation unit is operative to determine time offset between corresponding periodic pulses generated by the two timing units respectively by applying a single difference technique to corresponding ones of the pairs, the corresponding ones being defined by at least one time line defined by at least one receiver.

Additionally in accordance with at least one embodiment of the present invention, the frequency source is disciplined by an external time source serving as time source for both of the timing units and the nanosecond level accuracy measurement is produced for an unlimited time span.

Still further in accordance with at least one embodiment of the present invention, at least one of the timing units is mobile.

Further in accordance with at least one embodiment of the present invention, the receiver might be operative to generate additional periodic pulses synchronized with the time source and to provide the additional periodic pulses to the frequency source and wherein the frequency source uses the additional pulses in order to correct frequency drift between the frequency source and the time source.

Yet further in accordance with at least one embodiment of the present invention, each pulse generated by one timing unit and occurring at a first time, is taken by the computation unit to correspond to that pulse from among the pulses generated by another timing unit, whose time of occurrence is closest to the first time.

Additionally in accordance with at least one embodiment of the present invention, each timing unit includes a memory for storing at least a window of pulses, each pulse being associated with a time tag.

Further in accordance with at least one embodiment of the present invention, the system also comprises at least first and second additional devices co-located with respective ones of the timing units wherein the additional devices operate synchronously based on input provided by their co-located timing units.

Still further in accordance with at least one embodiment of the present invention, the input comprises at least one of the synchronization signals supplied by the frequency source of its co-located timing unit and at least one periodic pulse generated by the receiver of its co-located timing unit.

Additionally in accordance with at least one embodiment of the present invention, each additional device comprises a sensor, the system also comprising a processing unit operative to provide instantaneous and continuous nanosecond-level accuracy measurement of time elapsing between events occurring at the sensor and the sensor of the other additional system, the sensor being operative to receive an event and to perform an evaluation of a time period which has elapsed from receipt of the event back to a most recently generated pulse from among the periodic pulses generated by the timing unit co-located with the sensor, and wherein the evaluation of the time period is performed by counting the number of periods defined by the frequency source, elapsing between reception of the event back to a most recently generated pulse and summing the number with a difference between phases defined by the frequency source at a most recently generated pulse and at the event; wherein the processing unit is operative to compute a sum of the time offset and the difference between the time periods evaluated by the sensors respectively, thereby to measure time which has elapsed between events occurring at the sensors.

Still further in accordance with at least one embodiment of the present invention, the events respectively comprise reception of a single external occurrence by the sensors respectively.

Further in accordance with at least one embodiment of the present invention, each of the events comprises an electromagnetic pulse having a rise/fall time which is an order of magnitude less than the accuracy of the measurement of time elapsing between events.

Additionally in accordance with at least one embodiment of the present invention, the determining of time offset employs a common view time transfer procedure.

Further in accordance with at least one embodiment of the present invention, the time source comprises a GPS time source.

Still further in accordance with at least one embodiment of the present invention, the external signal stream, defining a time-line is provided to the receiver by the time source.

Additionally in accordance with at least one embodiment of the present invention, in each timing unit, the receiver supplies the frequency source with positioning data which is employed by the frequency source in order to correct frequency drift between the frequency source and the time source.

Also provided is a computer program product, comprising a computer usable medium or computer readable storage medium, typically tangible, having a computer readable program code embodied therein, the computer readable program code adapted to be executed to implement any or all of the methods shown and described herein. It is appreciated that any or all of the computational steps shown and described herein may be computer-implemented. The operations in accordance with the teachings herein may be performed by a computer specially constructed for the desired purposes or by a general purpose computer specially configured for the desired purpose by a computer program stored in a computer readable storage medium.

Any suitable processor, display and input means may be used to process, display, store and accept information, including computer programs, in accordance with some or all of the teachings of the present invention, such as but not limited to a conventional personal computer processor, workstation or other programmable device or computer or electronic computing device, either general-purpose or specifically constructed, for processing; a display screen and/or printer and/or speaker for displaying; machine-readable memory such as optical disks, CDROMs, magnetic-optical discs or other discs; RAMs, ROMs, EPROMs, EEPROMs, magnetic or optical or other cards, for storing, and keyboard or mouse for accepting. The term "process" as used above is intended to include any type of computation or manipulation or transformation of data represented as physical, e.g. electronic, phenomena which may occur or reside e.g. within registers and/or memories of a computer.

The above devices may communicate via any conventional wired or wireless digital communication means, e.g. via a wired or cellular telephone network or a computer network such as the Internet.

The apparatus of the present invention may include, according to certain embodiments of the invention, machine readable memory containing or otherwise storing a program of instructions which, when executed by the machine, implements some or all of the apparatus, methods, features and functionalities of the invention shown and described herein. Alternatively or in addition, the apparatus of the present invention may include, according to certain embodiments of the invention, a program as above which may be written in any conventional programming language, and optionally a machine for executing the program such as but not limited to a general purpose computer which may optionally be configured or activated in accordance with the teachings of the present invention. Any of the teachings incorporated herein may, wherever suitable, operate on signals representative of physical objects or substances.

The embodiments referred to above, and other embodiments, are described in detail in the next section.

Any trademark occurring in the text or drawings is the property of its owner and occurs herein merely to explain or illustrate one example of how an embodiment of the invention may be implemented.

Unless specifically stated otherwise, as apparent from the following discussions, it is appreciated that throughout the specification discussions, utilizing terms such as, “processing”, “computing”, “estimating”, “selecting”, “ranking”, “grading”, “calculating”, “determining”, “generating”, “reassessing”, “classifying”, “generating”, “producing”, “stereo-matching”, “registering”, “detecting”, “associating”, “superimposing”, “obtaining”or the like, refer to the action and/or processes of a computer or computing system, or processor or similar electronic computing device, that manipulate and/or transform data represented as physical, such as electronic, quantities within the computing system’s registers and/or memories, into other data similarly represented as physical quantities within the computing system’s memories, registers or other such information storage, transmission or display devices. The term “computer” should be broadly construed to cover any kind of electronic device with data processing capabilities, including, by way of non-limiting example, personal computers, servers, computing system, communication devices, processors (e.g. digital signal processor (DSP), microcontrollers, field programmable gate array (FPGA), application specific integrated circuit (ASIC), etc.) and other electronic computing devices.

The present invention may be described, merely for clarity, in terms of terminology specific to particular programming languages, operating systems, browsers, system versions, individual products, and the like. It will be appreciated that this terminology is intended to convey general principles of operation clearly and briefly, by way of example, and is not intended to limit the scope of the invention to any particular programming language, operating system, browser, system version, or individual product.

BRIEF DESCRIPTION OF THE DRAWINGS

Certain embodiments of the present invention are illustrated in the following drawings.

DETAILED DESCRIPTION OF CERTAIN EMBODIMENTS

Figure 1:
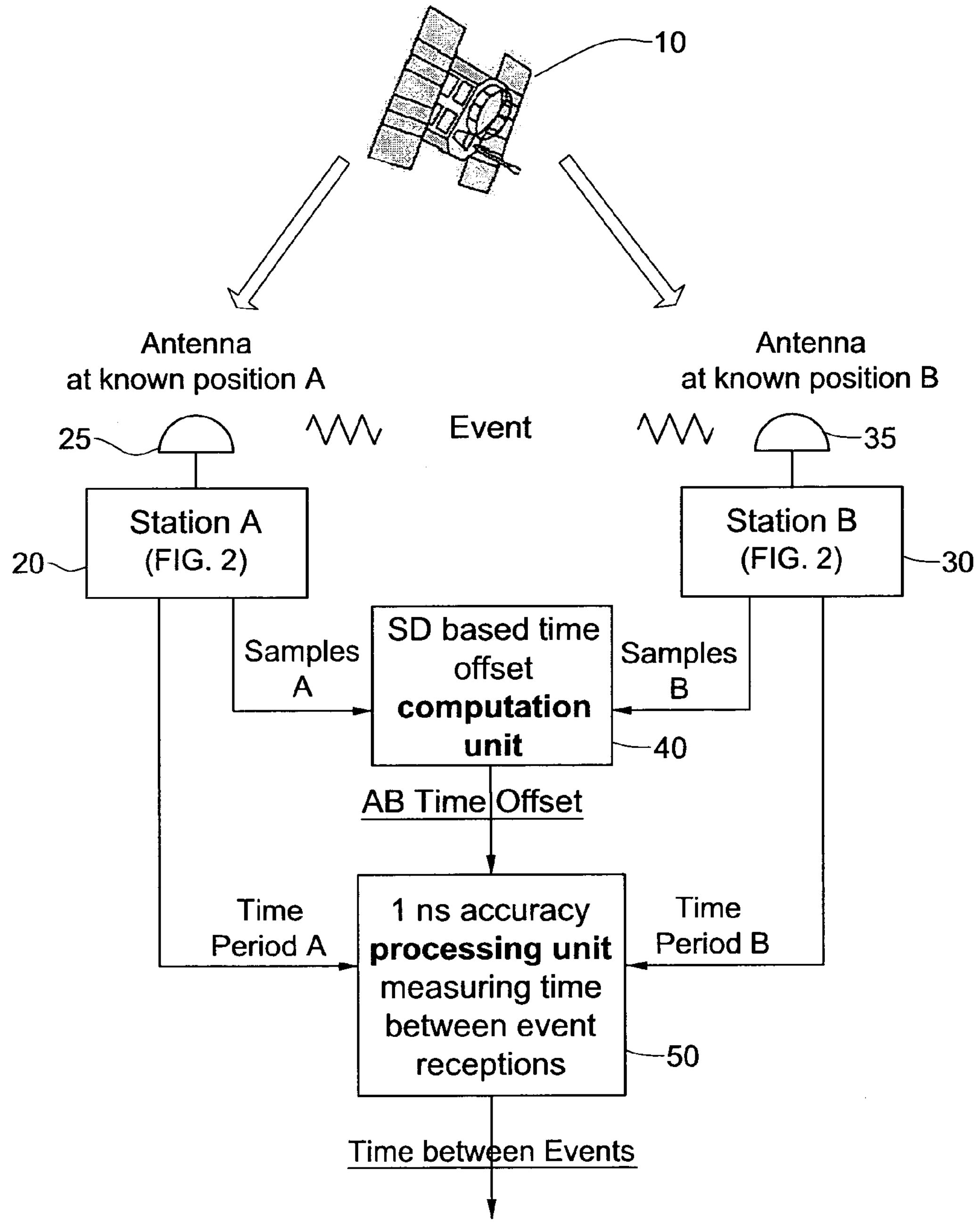
FIG. 1 is a simplified semi-pictorial semi-functional block diagram illustration of a system for Relative Time Measurement between two or more non-collocated stations 20 and 30 with known coordinates, constructed and operative in accordance with certain embodiments of the present invention.

Reference is now made to FIG. 1 which is a simplified semi-pictorial semi-functional block diagram illustration of a system for Relative Time Measurement between two or more non-collocated stations 20 and 30 with known coordinates, constructed and operative in accordance with certain embodiments of the present invention. Each station observes a Common External Signal (e.g. GNSS via GNSS antennae 25 and 35 respectively), produces time tagged samples (pseudo-range and integrated Doppler) based on a common external signal which may be generated by or generated responsive to a satellite 10 and senses a common external event. Each station computes a precise Time Period between an individual common sensed external event time tag and the time tag of the latest of the samples.

A time offset Computation Unit 40 receives samples from stations A and B and computes a Time Offset between station 20’s and station 30’s clocks at sampling time e.g. using Equations 1-4 below. The time offset information is provided to a nanosecond accuracy processing unit 50 which accurately measures time elapsing between events at stations A and B all as described in detail below.

The time offset computation performed by unit 40 is typically based on a conventional Single Difference (SD) algorithm e.g. as described in Bradford W. Parkinson and James J. Spilker, Global Positioning System: Theory and applications, Vol. II, Chapter 18, Eq. 9. An instant Time Offset is computed between the stations 20 and 30’s internal time scales using coherent pseudo-range and integrated Doppler Samples from each station and the Known Positions of the stations’ antennae 25 and 35.

Typically, the Single Difference (SD) algorithm implements the following linear combinations of coherent pseudo-range and carrier-phase (integrated Doppler), as follows (Equations 1 and 2):

$$P_{AB}{}^{S}=P_{B}{}^{S}-P_{A}{}^{S}=\rho_{AB}{}^{S}+\delta t_{AB}\cdot c+B_{AB}+I_{AB}{}^{S}+T_{AB}{}^{S}+\epsilon^{Code}$$

$$\Phi_{AB}{}^{S}=\Phi_{B}{}^{S}-\Phi_{A}{}^{S}=\rho_{AB}{}^{S}+\delta t_{AB}\cdot c+B_{AB}-I_{AB}{}^{S}+T_{AB}{}^{S}+F_{AB}{}^{S}+\epsilon^{Phase}$$

Where samples A provided by Station A of FIG. 1 include:

$P_A{}^S$—Pseudo-range measurement of satellite S (10 in FIG. 1) at station A; and $\Phi_A{}^S$—Carrier-phase measurement of satellite S (10 in FIG. 1) at station A, samples B provided by Station B of FIG. 1 include:

$P_B{}^S$—Pseudo-range measurement of satellite S (10 in FIG. 1) at station B; and $\Phi_B{}^S$—Carrier-phase measurement of satellite S (10 in FIG. 1) at station B;

and wherein:

$\rho_{AB}{}^S$=Difference in Ranges between stations A and B and satellite S c=Speed of light, $B_{AB}$=Hardware delays between stations A and B, e.g. as computed by the calibration apparatus of FIG. 5 described in detail below $I_{AB}^{S}$=Difference in ionospheric delays between stations A and B to satellite S (10 in FIG. 1)

$T_{AB}^{S}$=Difference in tropospheric delays between stations A and B to satellite S (10 in FIG. 1)

$F_{AB}^{S}$=Difference in floating ambiguities between stations A and B to satellite S (10 in FIG. 1), e.g. as computed by the calibration apparatus of FIG. 5 described in detail below $\epsilon^{Code}$=Pseudo-range sampling noise $\epsilon^{Phase}$=Carrier Phase sampling noise $\delta t_{AB}$=Time difference between stations A and B, e.g. as computed by Equation 5 described below=AB time offset of FIG. 1.

Parameter $\rho_{AB}^{S}$ is known based on satellite and stations' positions. Parameters $I_{AB}^{S}$ and $T_{AB}^{S}$ are modeled using standard procedures such as those described in the above—described textbook: *Global Positioning System: Theory and applications*, at Vol. II, Chapter 18, Eq. 12, at Vol. I, Chapter 11, Eq. 20, and at Eq. 32. $B_{AB}$ is a hardware delay measured once per each pair of stations. This results in the following equations, which may be solved by the Computation Unit 40 using least squares techniques for unknown Time Offset ($\delta t_{AB}$) and $F_{AB}^{S}$ respectively:

$$\tilde{P}_{AB}^{S}=\delta t_{AB}\cdot c+\epsilon_{AB}^{Code}$$

$$\tilde{\Phi}_{AB}^{S}=\delta t_{AB}\cdot c+F_{AB}^{S}+\epsilon_{AB}^{Phase} \quad \text{(Equations 3 and 4)}$$

One method of operation for the nanosecond accuracy processing unit 50 of FIG. 1 is now described in detail. Based on Time Periods which may be computed by sensor 110 in stations 20 and 30, e.g. as per Equation 6 as described in detail below, and based also on Time Offset between stations' clocks as derived by Equations 3 and 4, Processing Unit 50 computes a Relative Time Measurement $dT^{BA}_{EVENT}$, also termed herein the "time between events", between stations 20 and 30, e.g. as per the following equation 5:

$$dT^{AB}_{EVENT}=T_{PERIOD}^{B}-T_{PERIOD}^{A}+\delta t_{AB} \quad \text{(Equation 5),}$$

where:

$dT^{AB}_{EVENT}$—Relative Time Measurement of event reception at stations A and B, also termed "precise relative time" or "time between events" (FIG. 1)

$\delta t_{AB}$—Time Offset between station's clocks at sampling time, typically derived from Equations 3 and 4 by Computation Unit 40 and supplied as "AB time offset" input to processing unit 50 as shown in FIG. 1

$T_{PERIOD}^{A}$—Time Period between sensing of the external event by station A and station A's latest sample time, computed by station A as described in detail below (equation 6). Also termed (e.g. in FIG. 1) "time period A"

—Time Period between sensing of the external event by station B and station B's latest sample time, computed by station B as described in detail below (equation 6). Also termed (e.g. in FIG. 1) "time period B"

Figure 2:
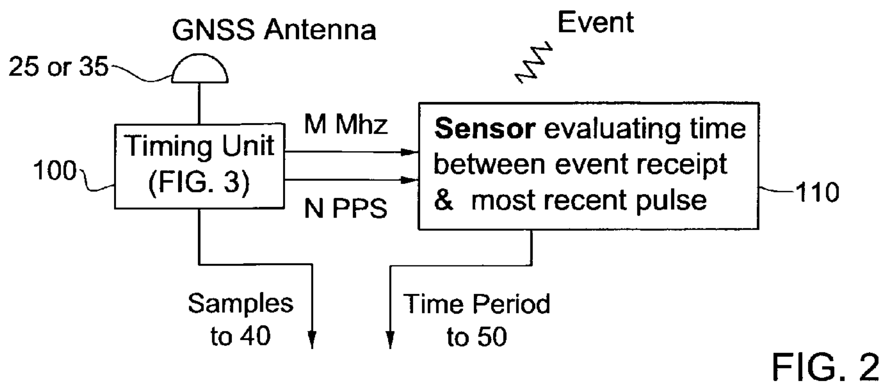
FIG. 2 is a simplified semi-pictorial semi-functional block diagram illustration of an individual one of the stations of FIG. 1 and its associated antenna, constructed and operative in accordance with certain embodiments of the present invention.

Reference is now made to FIG. 2 which is a simplified semi-pictorial semi-functional block diagram illustration of an individual one of stations 20, 30 of FIG. 1 and its associated antenna 25 or 35 respectively. As shown, each station may comprise Timing Unit 100 and Sensor 110. Timing Unit 100 is capable of producing stable frequency and a corresponding PPS signal provided to the Sensor 110 unit. Additionally, Timing Unit 100 provides coherent pseudo-range and integrated Doppler Samples of the external signal as sensed by the station's antenna, 25 or 35.

Stations 20 or 30's sensor unit 110 is operative to sense the external event and evaluate, e.g. using Equation 6 below, the Time Period between the external event's arrival and the latest PPS signal from Timing Unit 100, based on timing unit 100's frequency output. This evaluation may be performed by counting the number of periods of Timing unit 100's frequency output, elapsing between reception of the external event back to a most recently generated PPS signal and summing this number with a difference between phases of Timing unit 100's frequency source 210 at a most recently generated pulse and at the external event:

$$T_{PERIOD} = \frac{\lambda}{c}\left(N_{CYCLES} + \frac{\varphi_{EVENT} - \varphi_{PPS}}{2\pi}\right), \quad \text{(Equation 6)}$$

where $T_{PERIOD}$—Time Period between External Event and arrival of latest PPS signal.

Figure 3:
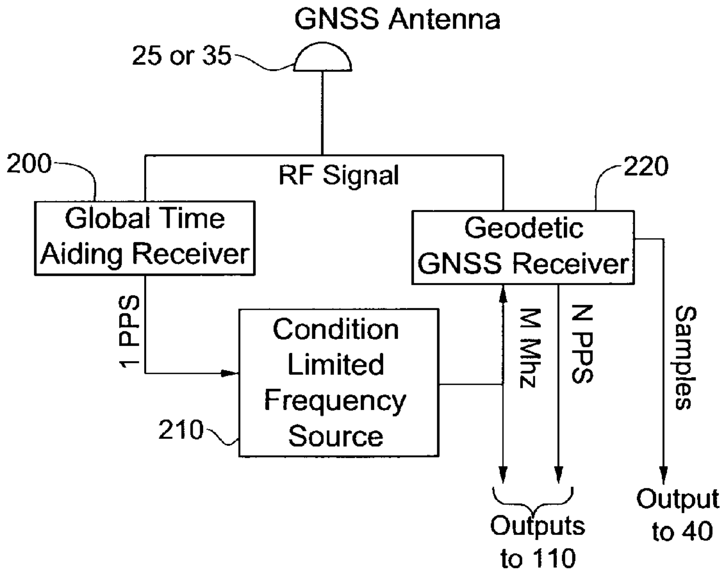
FIG. 3 is a simplified functional block diagram of the Timing Unit of FIG. 2, constructed and operative in accordance with certain embodiments of the present invention.

$N_{CYCLES}$—Number of whole periods of Timing unit 100's frequency source elapsing between the most recently generated pulse and the reception of the external event λ—Timing unit 100's frequency output wavelength $\phi_{EVENT}$—Timing unit 100's frequency source phase as sensed by Sensor unit 110 during the external event $\phi_{PPS}$—Timing unit 100's frequency source phase as sensed by Sensor unit 110 during most recent pulse Reference is now made to FIG. 3 which is a simplified functional block diagram of Timing Unit 100 of FIG. 2, constructed and operative in accordance with certain embodiments of the present invention. As shown, each Timing Unit 100 may comprise a Frequency Source 210 and a Receiver 220 of an external signal stream e.g. a stream of GNSS signals. The Receiver 220's internal oscillator is disciplined at a frequency domain by the Frequency Source 210. The Receiver 220 samples the external signal periodically, e.g. once per time period of dT=1 second, and outputs the resulting external signal samples (e.g. Pseudo-Range and Integrated Doppler) synchronously with a PPS signal.

The Frequency source 210 itself is suitably disciplined at a frequency domain by global time aiding receiver 200 (e.g. second receiver) e.g. as follows: The Frequency Source 210 corrects its frequency drift limited by the following condition: the sum of all frequency corrections ($\Sigma^{\delta F}$) effected during the noted time period divided by disciplined frequency is at least one order of magnitude less than the required accuracy:

$$\frac{dT \cdot \sum \delta F}{F_0} < 0.1 \text{ ns}, \quad \text{(Equation 7)}$$

Figure 4:
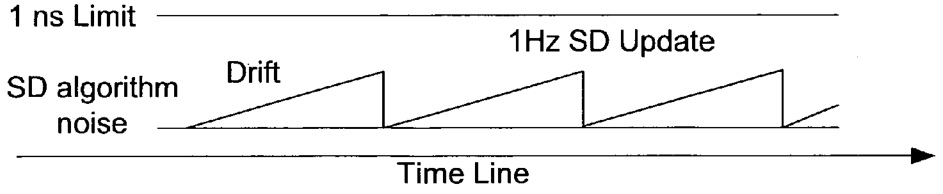
FIG. 4 is a graph of a System Error Budget of the relative time measurement system of FIG. 1, in accordance with certain embodiments of the present invention.

FIG. 4 is a graph of a System Error Budget of the relative time measurement system of FIG. 1. As shown, in the illustrated embodiment, the error remains below 1 nanosecond. The continuous time measurement with nanosecond accuracy is based on a single difference (SD) algorithm and a relative frequency low drift capability between the updates. Nanosecond accuracy is achieved when single-difference technique noise is at order of 0.5 nanosecond (i.e. 15 cm) and relative frequency drift is one order less than required accuracy i.e. 0.1 nanosecond per one SD update period.

Timing Units 100's coordinates are known at the decimeter level (0.3 nanosecond), PPS output and frequency adding mechanisms in Timing Units are known to be of an order of 0.1-0.2 nanoseconds, each pair of Timing Units 100 is calibrated once prior to their usage at a level of accuracy of 0.3 nanoseconds, and carrier phase measurements' noise is less than 1/30 nanosecond. Thus System Error Budget is maintained below 1 nanosecond, as shown in FIG. 4.

One suitable method for relative internal bias calibration of the system of FIG. 1, during set-up, is now described with reference to FIG. 5 which is a simplified functional block diagram of relative internal bias calibration apparatus in conjunction with a pair of timing units of the type shown in FIG. 3. The relative internal bias calibration apparatus of FIG. 5 includes an external stable frequency source 300 and a Time Counter 310 as shown. An external frequency governs frequency sources 210 and 210' in Timing Units 100 and 100' respectively, in the frequency domain. Additionally, an external stable frequency 300 governs Time Counter 310 used for evaluating the Time Offset between PPS signals of Timing Units 100 and 100'.

Relative internal bias $B_{AB}$ typically comprises two components which are constant for a given pair of Timing Units 100 and 100': offset between hardware delays at RF lines and offset between delays of internal IPPS generation. The offset between hardware delays at RF lines comprises e.g. differences in delays at antennas, cables, RF front ends and other hardware elements. The offset between delays of internal 1PPS generation comprises differences between thresholds of 1PPS generation circuits and external frequency locking loops. Both these offsets are correlated and thus typically calibrated as one Relative internal bias value.

Hardware delays, being relevant to GNSS receivers 220 and 220' in the Timing Units 100 and 100' only, may be calibrated as follows: an external stable frequency from source 300 governs each Timing Unit 100's frequency sources 210 thus eliminating any frequency drift between them, whereas Time Counter 310 (FIG. 5) evaluates $\delta t_{AB}$, the Time Offset between Timing Unit 100's PPS signals.

By making use of Samples from both timing units 100 and 100', a Single Difference equation can be constructed (Equations 7 and 8):

$$\tilde{P}_{AB}{}^{S}=B_{AB}+\epsilon_{AB}{}^{Code}$$

$$\tilde{\Phi}_{AB}{}^{S}=B_{AB}+F_{AB}{}^{S}+\epsilon_{AB}{}^{Phase}$$

Figure 5:
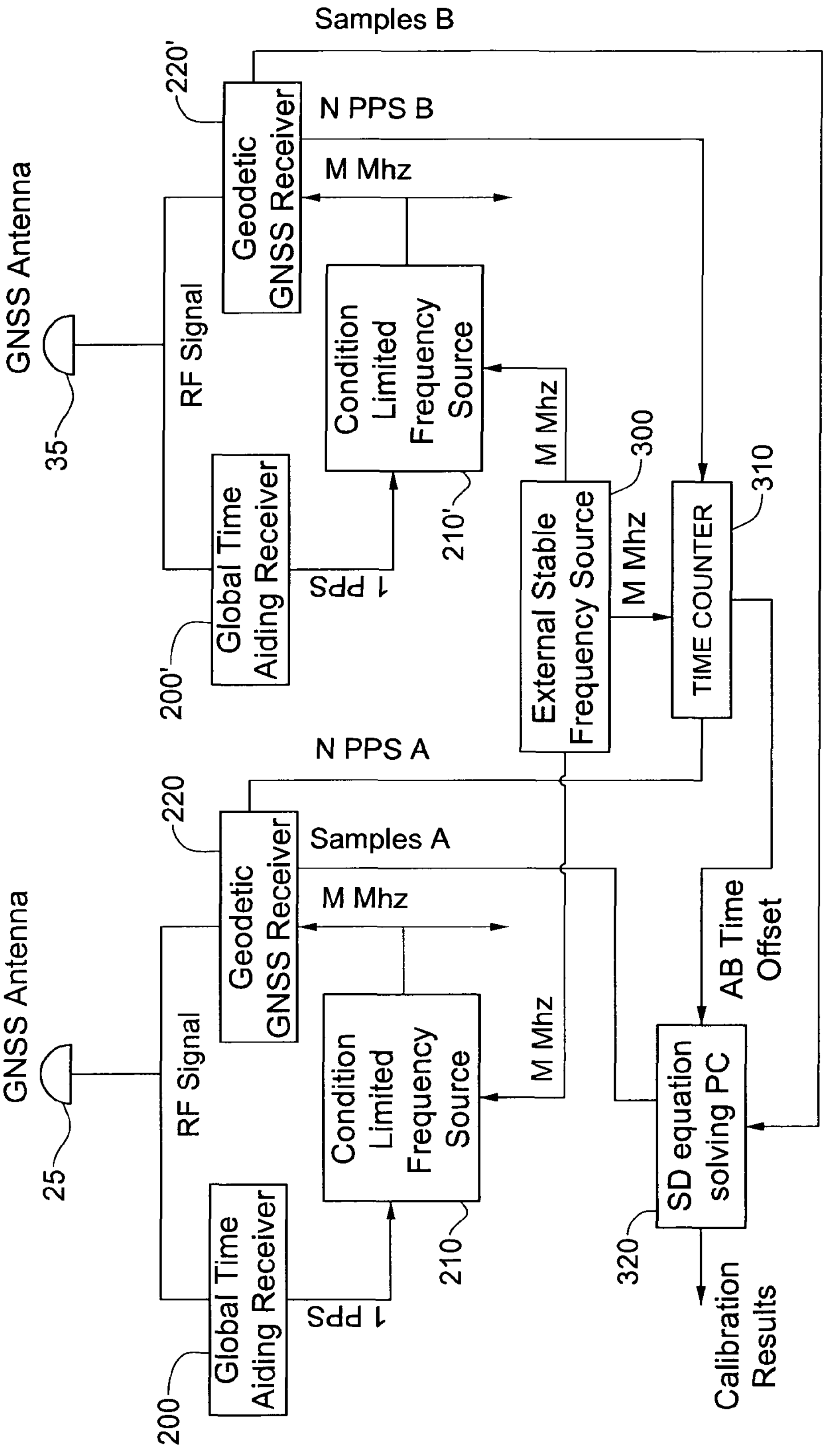
FIG. 5 is a simplified functional block diagram of relative internal bias calibration apparatus in conjunction with a pair of timing units of the type shown in FIG. 3, all constructed and operative in accordance with certain embodiments of the present invention.

These equations may be solved externally by single difference equation solving computer 320 of FIG. 5, which may for example comprise a suitably programmed personal computer using least squares techniques to determine calibration results including unknown Relative internal bias $B_{AB}$ and $F_{AB}{}^{S}$, for equations 1 and 2, as described above.

Figure 6:
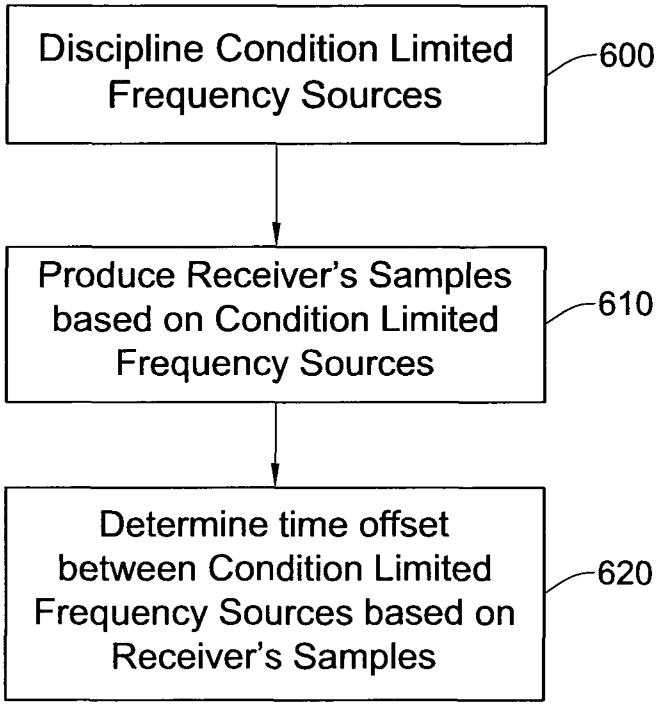
FIG. 6 is a simplified flowchart illustration of a method for instantaneous and continuous determination of a relative time offset between non-collocated frequency sources having a relative frequency drift therebetween, the determination being carried out at a required nanosecond level accuracy, all operative in accordance with certain embodiments of the present invention.

FIG. 6 is a simplified flowchart illustration of a method for instantaneous and continuous determination of a relative time offset between non-collocated frequency sources such as those shown in FIG. 3, having a relative frequency drift therebetween, the determination being carried out at a required nanosecond level accuracy, all operative in accordance with certain embodiments of the present invention.

A particular advantage of certain embodiments of the present invention is that the system shown and described herein does not require preliminary time synchronization between the two platforms and is able to supply the relative time measurement for an unlimited time span. The two platform locations are presumed to be known with sub-decimeter level accuracy, whereas the distance between the platforms may increase up to a few dozen kilometers.

It is appreciated that software components of the present invention including programs and data may, if desired, be implemented in ROM (read only memory) form including CD-ROMs, EPROMs and EEPROMs, or may be stored in any other suitable computer-readable medium such as but not limited to disks of various kinds, cards of various kinds and RAMs. Components described herein as software may, alternatively, be implemented wholly or partly in hardware, if desired, using conventional techniques.

Included in the scope of the present invention, inter alia, are electromagnetic signals carrying computer-readable instructions for performing any or all of the steps of any of the methods shown and described herein, in any suitable order; machine-readable instructions for performing any or all of the steps of any of the methods shown and described herein, in any suitable order; program storage devices readable by machine, tangibly embodying a program of instructions executable by the machine to perform any or all of the steps of any of the methods shown and described herein, in any suitable order; a computer program product comprising a computer useable medium having computer readable program code having embodied therein, and/or including computer readable program code for performing, any or all of the steps of any of the methods shown and described herein, in any suitable order; any technical effects brought about by any or all of the steps of any of the methods shown and described herein, when performed in any suitable order; any suitable apparatus or device or combination of such, programmed to perform, alone or in combination, any or all of the steps of any of the methods shown and described herein, in any suitable order; information storage devices or physical records, such as disks or hard drives, causing a computer or other device to be configured so as to carry out any or all of the steps of any of the methods shown and described herein, in any suitable order; a program pre-stored e.g. in memory or on an information network such as the Internet, before or after being downloaded, which embodies any or all of the steps of any of the methods shown and described herein, in any suitable order, and the method of uploading or downloading such, and a system including server/s and/or client/s for using such; and hardware which performs any or all of the steps of any of the methods shown and described herein, in any suitable order, either alone or in conjunction with software.

Features of the present invention which are described in the context of separate embodiments may also be provided in combination in a single embodiment. Conversely, features of the invention, including method steps, which are described for brevity in the context of a single embodiment or in a certain order may be provided separately or in any suitable sub-combination or in a different order. "e.g." is used herein in the sense of a specific example which is not intended to be limiting. Devices, apparatus or systems shown coupled in any of the drawings may in fact be integrated into a single platform in certain embodiments or may be coupled via any appropriate wired or wireless coupling such as but not limited to optical fiber, Ethernet, Wireless LAN, HomePNA, power line communication, cell phone, PDA, Blackberry GPRS, Satellite including GPS, or other mobile delivery.

The invention claimed is:

1. A method for instantaneous and continuous determination of a relative time offset between non-collocated frequency sources having a relative frequency drift therebetween, said determination being carried out at a required nanosecond level accuracy, the method comprising:

providing at least two non-collocated timing units located at known positions, each timing unit comprising a frequency source and a collocated receiver, wherein each said receiver is synchronized by a synchronization signal supplied by said frequency source and is operative to receive an external signal stream defining a time-line and to derive therefrom a stream of pseudo-range sample and integrated Doppler sample pairs, to generate, for each individual pair in at least a subset of said pairs, a periodic pulse synchronized with said frequency source, thereby to define a periodic pulse corresponding to said individual pair and to output each individual pair in said subset, simultaneously with the individual pair's corresponding periodic pulse;

disciplining of frequency drift between the frequency sources at a frequency domain including computing, and applying to the frequency sources, corrections of a relative frequency drift between each frequency source and a single time source, said disciplining being limited by the following condition: the product of a duration of any time period extending between adjacent discrete points of time in a sequence of discrete points of time, times the sum of all frequency corrections effected during said time period divided by a frequency value characterizing the frequency sources, is at least one order of magnitude less than the required accuracy; and determining time offset between said non-collocated frequency sources at each discrete point of time in said sequence of discrete points of time.

2. A method according to claim 1 wherein said determining of time offset employs a common view time transfer procedure.

3. A method according to claim 1 wherein said time source comprises a GNSS time source.

4. A method according to claim 1 wherein said frequency value characterizing the frequency sources comprises a frequency of the frequency sources at a beginning point of said time period.

5. A system for instantaneous and continuous nanosecond-level accuracy determination of a relative time offset between at least two non-collocated timing units, the system comprising:

at least two non-collocated timing units located at known positions, each timing unit comprising a frequency source and a collocated receiver, each said frequency source being disciplined at a frequency domain using a time source to generate corrections of the relative frequency drift between said frequency source and said time source so as to be limited by the following condition: the product of a duration of any time period extending between adjacent discrete points of time in a sequence of discrete points of time, multiplied by the sum of all frequency corrections effected during the time period and divided by a frequency value characterizing the frequency sources, is at least one order of magnitude less than the required accuracy, each said receiver being synchronized by a synchronization signal supplied by said frequency source and being operative to receive an external signal stream defining a time-line and to derive therefrom a stream of pseudorange sample and integrated Doppler sample pairs, to generate, for each individual pair in at least a subset of said pairs, a periodic pulse synchronized with said frequency source, thereby to define a periodic pulse corresponding to said individual pair and to output each individual pair in said subset, simultaneously with the individual pair's corresponding periodic pulse; and at least one time offset computation unit operative to use said timing units' known positions and at least one sample pair from each of said timing units in order to compute time offset between periodic pulses generated by said two timing units respectively, using a single difference technique.

6. A system according to claim 5 wherein the positions of non-collocated timing units are known at least at decimeter level.

7. A system according to claim 5 wherein said computation unit is operative to determine time offset between corresponding periodic pulses generated by said two timing units respectively by applying a single difference technique to corresponding ones of said pairs, said corresponding ones being defined by at least one time line defined by at least one receiver.

8. A system according to claim 7 wherein each pulse generated by one timing unit and occurring at a first time, is taken by said computation unit to correspond to that pulse from among the pulses generated by another timing unit, whose time of occurrence is closest to said first time.

9. A system according to claim 5 wherein said frequency source is disciplined by an external time source serving as time source for both of said timing units and said nanosecond level accuracy measurement is produced for an unlimited time span.

10. A system according to claim 5 wherein at least one of said timing units is mobile.

11. A system according to claim 5 wherein, in each timing unit, said receiver supplies the frequency source with positioning data which is employed by the frequency source in order to correct frequency drift between said frequency source and said time source.

12. A system according to claim 5 wherein said receiver is operative to generate additional periodic pulses synchronized with the time source and to provide said additional periodic pulses to the frequency source and wherein said frequency source uses said additional pulses in order to correct frequency drift between said frequency source and said time source.

13. A system according to claim 5 wherein each said timing unit includes a memory for storing at least a window of pulses, each pulse being associated with a time tag.

14. A system according to claim 5 and also comprising at least first and second additional devices co-located with respective ones of said timing units wherein said additional devices operate synchronously based on input provided by their co-located timing units.

15. A system according to claim 14 wherein said input comprises at least one of said synchronization signals supplied by the frequency source of its co-located timing unit and at least one periodic pulse generated by the receiver of its co-located timing unit.

16. A system according to claim 15 wherein each said additional device comprises a sensor, the system also comprising a processing unit operative to provide instantaneous and continuous nanosecond-level accuracy measurement of time elapsing between events occurring at said sensor and the sensor of the other additional system, the sensor being operative to receive an event and to perform an evaluation of a time period which has elapsed from receipt of said event back to a most recently generated pulse from among said periodic pulses generated by the timing unit co-located with the sensor, and wherein said evaluation of said time period is performed by counting the number of periods defined by said frequency source, elapsing between reception of said event back to a most recently generated pulse and summing said number with a difference between phases defined by said frequency source at a most recently generated pulse and at said event;

wherein said processing unit is operative to compute a sum of said time offset and the difference between said time periods evaluated by said sensors respectively, thereby to measure time which has elapsed between events occurring at the sensors.

17. A system according to claim 16 wherein said events respectively comprise reception of a single external occurrence by said sensors respectively.

18. A system according to claim 16 wherein each of said events comprises an electromagnetic pulse having a rise/fall time which is an order of magnitude less than said accuracy of said measurement of time elapsing between events.

19. A system according to claim 5 wherein said external signal stream defining a time-line is provided to said receiver by said time source.

20. A system according to claim 5 wherein said time offset is determined by employing a common view time transfer procedure.

21. A system according to claim 5 wherein said time source comprises a GNSS time source.

22. A system according to claim 5 wherein said frequency value characterizing the frequency sources comprises a frequency of the frequency sources at a beginning point of said time period.

23. A non-transitory computer usable medium having a computer readable program code embodied therein, said computer readable program code adapted to be executed to implement a method for instantaneous and continuous determination of a relative time offset between non-collocated frequency sources having a relative frequency drift therebetween, said determination being carried out at a required nanosecond level accuracy, the method comprising:

computing, and applying to the frequency sources, for disciplining of frequency drift between the frequency sources at a frequency domain, corrections of a relative frequency drift between each frequency source and a single time source, said disciplining being limited by the following condition: the product of a duration of any time period extending between adjacent discrete points of time in a sequence of discrete points of time, times the sum of all frequency corrections effected during said time period divided by a frequency value characterizing the frequency sources, is at least one order of magnitude less than the required accuracy; and determining time offset between said non-collocated frequency sources at each discrete point of time in said sequence of discrete points of time.

* * * * *